US009655253B2

(12) United States Patent
Lu et al.

(10) Patent No.: US 9,655,253 B2
(45) Date of Patent: May 16, 2017

(54) METHOD OF FABRICATION OF ENCAPSULATED ELECTRONICS DEVICES MOUNTED ON A REDISTRIBUTION LAYER

(71) Applicants: Bau-Ru Lu, Changhua County (TW); Ming-Chia Wu, Hsinchu (TW)

(72) Inventors: Bau-Ru Lu, Changhua County (TW); Ming-Chia Wu, Hsinchu (TW)

(73) Assignee: CYNTEC CO., LTD., Hsinchu (TW)

( * ) Notice: Subject to any disclaimer, the term of this patent is extended or adjusted under 35 U.S.C. 154(b) by 202 days.

(21) Appl. No.: 13/950,335

(22) Filed: Jul. 25, 2013

(65) Prior Publication Data
US 2015/0029678 A1 Jan. 29, 2015

(51) Int. Cl.
| H01L 21/00 | (2006.01) |
| H05K 1/18 | (2006.01) |
| H01L 23/12 | (2006.01) |
| H05K 3/28 | (2006.01) |
| H01L 23/538 | (2006.01) |
| H01L 23/00 | (2006.01) |
| H01L 21/683 | (2006.01) |
| H01L 21/56 | (2006.01) |
| H05K 1/02 | (2006.01) |

(52) U.S. Cl.
CPC ........... *H05K 3/284* (2013.01); *H01L 21/568* (2013.01); *H01L 21/6835* (2013.01); *H01L 23/5389* (2013.01); *H01L 24/19* (2013.01); *H01L 24/96* (2013.01); *H01L 24/97* (2013.01); *H01L 21/56* (2013.01); *H01L 2224/04105* (2013.01); *H01L 2224/24137* (2013.01); *H01L 2924/19041* (2013.01); *H01L 2924/19043* (2013.01); *H01L 2924/19105* (2013.01); *H01L 2924/3025* (2013.01); *H05K 1/0218* (2013.01)

(58) Field of Classification Search
CPC ............... H01L 23/5386; H01L 23/528; H01L 23/49838; H01L 21/56; H01L 24/96; H01L 24/82; H01L 24/19; H01L 24/97; H01L 21/568; H01L 23/5389; H01L 21/6835; H05K 3/284
See application file for complete search history.

(56) References Cited

U.S. PATENT DOCUMENTS

| 8,624,359 | B2 * | 1/2014 | Yang et al. | .................... 257/620 |
| 2011/0316146 | A1 * | 12/2011 | Pagaila et al. | ................. 257/737 |
| 2012/0161279 | A1 * | 6/2012 | Lin | ........................ H01L 21/561 257/531 |
| 2013/0093069 | A1 * | 4/2013 | Lu | ........................... H01L 23/13 257/666 |
| 2014/0008809 | A1 * | 1/2014 | Scanlan | ......................... 257/773 |
| 2014/0077394 | A1 * | 3/2014 | Chang et al. | ................. 257/782 |
| 2014/0293529 | A1 * | 10/2014 | Nair | ..................... H01Q 1/2291 361/679.31 |

(Continued)

*Primary Examiner* — Alonzo Chambliss
(74) *Attorney, Agent, or Firm* — Min-Lee Teng; Litron Patent & Trademark Office

(57) ABSTRACT

A substrateless device comprises a plurality of first conductive elements and an encapsulant. The encapsulant encapsulates the plurality of first conductive elements, wherein the locations of the plurality of first conductive elements are fixed by the encapsulant; and a plurality of terminals of the plurality of first conductive elements are exposed outside the encapsulant, wherein the plurality of first conductive elements are not supported by a substrate.

11 Claims, 4 Drawing Sheets

(56) References Cited

U.S. PATENT DOCUMENTS

2015/0084206 A1\* 3/2015 Lin ................... H01L 23/3135
257/774
2015/0262977 A1\* 9/2015 Pagaila ................ H01L 21/561
257/773

\* cited by examiner

METHOD OF FABRICATION OF ENCAPSULATED ELECTRONICS DEVICES MOUNTED ON A REDISTRIBUTION LAYER

BACKGROUND OF THE INVENTION

I. Field of the Invention

The present invention relates to a package structure and, in particular, to a substrateless device.

II. Description of the Prior Art

Lead frame is a material for IC package and can be in variety of forms such as QFP, TSOP, SOT or SOJ. The molded semiconductor devices are constructed by assembling and interconnecting a semiconductor device to a lead frame. The structure is often molded with plastic material. A lead frame is made by a metal ribbon with a paddle (also known as a die paddle, die-attach tab, or island) for attaching a semiconductor device thereto and a plurality of leads arranged in a manner such that the leads do not overlap the paddle on which the semiconductor device is to be mounted.

Conventionally, lead frame is used for die bond of an IC chip. The process flow includes many stages which include wire bond, molding of IC chip, and the tests after trimming or forming. Various products can be made by integrating or packaging the lead frame with other devices such as inductors or capacitors. It's one of the main package processes in the industry due to its easiness, maturity and better reliability. However, such kind of conventional process has many disadvantages including: a. higher cost and more development works of molding devices; b. poor capability in area design which is only in the form of plane so that product size doesn't shrink; c. lacking of modular capability as it is only good for packaging a single device; d. poor performance in heat dissipation and poor yield; and e. Hard to shrink the module size because of the lead frame of a bulk volume. Accordingly, the present invention proposes a substrateless device and its manufacturing method to overcome the above-mentioned disadvantages.

SUMMARY OF THE INVENTION

One objective of the present invention is to provide a substrateless device which is not supported by a substrate. It doesn't need a lead frame or a PCB to support the conductive elements so that the material cost can be reduced and device size can be shrunk. Moreover, the pin location and the pin number of the device can be modified according to design demand. The substrateless device comprises: a plurality of first conductive elements; and an encapsulant encapsulating the plurality of first conductive elements, wherein the locations of the plurality of first conductive elements are fixed by the encapsulant; and a plurality of terminals of the plurality of first conductive elements are exposed outside the encapsulant, wherein the plurality of first conductive elements are not supported by a substrate.

Preferably, the terminals of the first conductive elements are exposed outside the bottom surface of the encapsulant. The substrateless device can further comprise a circuit pattern layer disposed on the bottom surface of the encapsulant.

Another objective of the present invention is to provide a method of forming a substrateless device. The method comprises the steps of: providing a plurality of first conductive elements; and forming an encapsulant to encapsulate the plurality of first conductive elements, wherein the locations of the plurality of first conductive elements are fixed by the encapsulant; and a plurality of terminals of the plurality of first conductive elements are exposed outside the encapsulant, wherein the plurality of first conductive elements are not supported by a substrate.

In the preferred embodiment, a supporting body is provided; a plurality of first conductive elements are disposed on the supporting body; an encapsulant is formed to encapsulate the plurality of first conductive elements; and the supporting body is removed to expose a plurality of terminals of the plurality of first conductive elements. The function of the supporting body is to position a conductive element thereon. The supporting body can be a carrier (e.g., glass substrate) or an adhesive tape.

The detailed technology and above preferred embodiments implemented for the present invention are described in the following paragraphs accompanying the appended drawings for people skilled in this field to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF THE INVENTION

The detailed explanation of the present invention is described as following. The described preferred embodiments are presented for purposes of illustrations and description and they are not intended to limit the scope of the present invention.

The invention discloses a substrateless device which is not supported by a substrate. The substrateless device comprises: a plurality of first conductive elements; and an encapsulant encapsulating the plurality of first conductive elements, wherein the locations of the plurality of first conductive elements are fixed by the encapsulant; and a plurality of terminals of the plurality of first conductive elements are exposed outside the encapsulant, wherein the plurality of first conductive elements are not supported by a substrate. The advantages of the substrateless device include the followings: 1. it doesn't need a lead frame or a PCB to support the conductive elements so that the material cost can be reduced and device size can be shrunk; 2. the pin location and the pin number of the device can be modified according to design demand; 3. the device has the shortest circuit path such that circuit impedance can be reduced and electrical efficiency can be raised; 4. it is suitable for circuit modularization. 5. it is suitable for surface mount technology (SMT); 6. the encapsulant can protect the conductive elements therein; 7. electroplating via-process can be used in forming a circuit pattern layer to reduce impedance and dissipate heat; 8. it has smaller module area due to device integration and space stack.

Figure 1A:
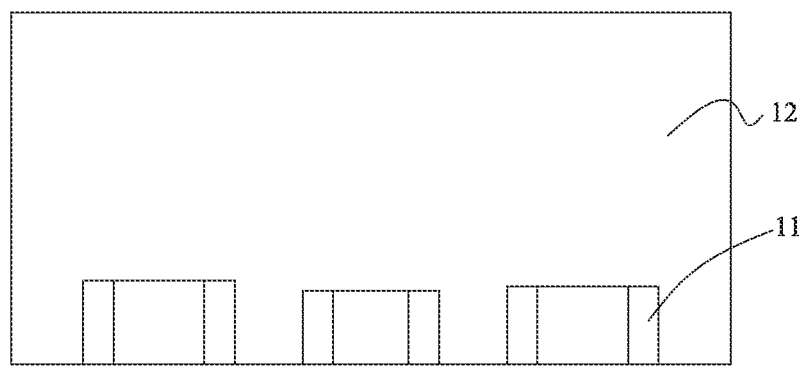
FIG. 1A illustrates a schematic cross-sectional view of a substrateless device in the present invention.
Figure 1B:
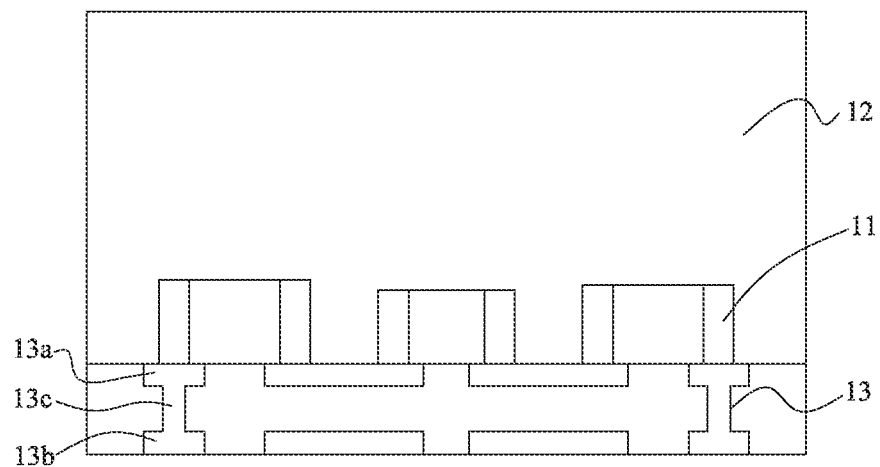
FIG. 1B illustrates a schematic cross-sectional view of a substrateless device having a circuit pattern layer on the bottom surface of the encapsulant.

FIG. 1A illustrates a schematic cross-sectional view of a substrateless device 10 in the present invention. FIG. 1B illustrates a schematic cross-sectional view of a substrateless device 10 having a circuit pattern layer 13 on the bottom surface of the encapsulant 12. The substrateless device 10 includes a plurality of first conductive elements 11 and an encapsulant 12. Preferably, the substrateless device 10 has a circuit pattern layer 13 on the bottom surface of the encapsulant 12.

Each of the first conductive elements 11 can comprise at least one of IC chip, MOSFET, IGBT, diode, resistor, choke or capacitor. An encapsulant 12 is formed to encapsulate the first conductive elements 11. The encapsulant 12 can be made of any suitable material, such as epoxy, oxide or a polymer-based material. A plurality of terminals of the first conductive elements 11 are exposed outside the encapsulant 12 to function as electrodes. Preferably, the terminals of the first conductive elements 11 are exposed outside the bottom surface of the encapsulant 12. In other words, the electrodes of the first conductive elements 11 are disposed on the surface, preferably the bottom surface, of the encapsulant 12 for external electrical connection such that the distance between the first conductive elements 11 can be reduced.

In the preferred embodiment, refer to FIG. 1B, a circuit pattern layer 13 is formed on the bottom surface of the encapsulant 12 to electrically connect the terminals of the first conductive elements 11 to make electrical connection between the first conductive elements 11 and to further extend the electrodes of the first conductive elements 11 for external connection. Preferably, the circuit pattern layer 13 is in direct contact with the terminals of the first conductive elements 11. The circuit pattern layer 13 can comprise a plurality of circuit layers. For example, the circuit pattern layer 13 comprises a top RDL (redistribution layer) 13a, a bottom RDL 13b and a via layer 13c between the top RDL 13a and the bottom RDL 13b. The top RDL 13a makes electrical connection between the first conductive elements 11, and bottom RDL 13b further extends the electrodes of the first conductive elements 11 for external connection.

Figure 1C:
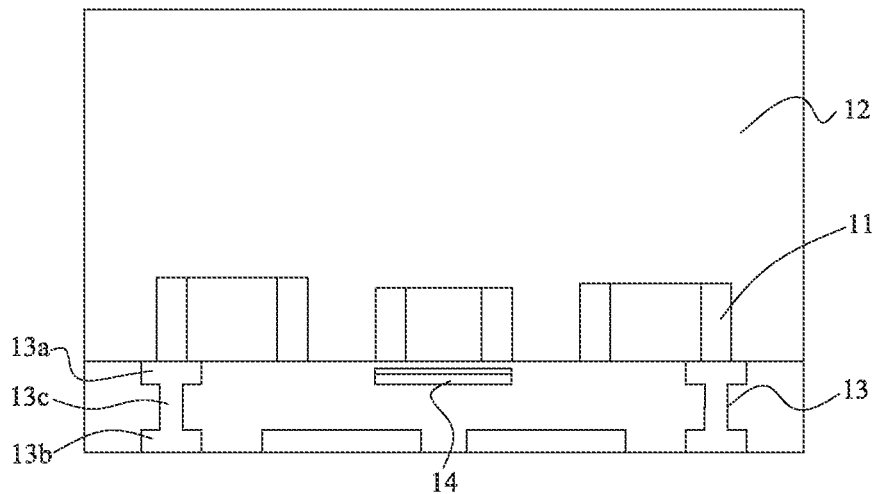
FIG. 1C illustrates a schematic cross-sectional view of a substrateless device, wherein a second conductive element is disposed in the circuit pattern layer.

FIG. 1C illustrates a schematic cross-sectional view of a substrateless device 10, wherein a second conductive element 14 is disposed in the circuit pattern layer 13. To shrink module size, the second conductive element 14 can be disposed in the circuit pattern layer 13. The second conductive element 14 has at least one terminal (not shown), and at least one terminal of the second conductive element 14 is electrically connected the circuit pattern layer 13. There are many ways to dispose the second conductive element(s) 14: the second conductive element 14 can be disposed in one of the circuit layers; one of the second conductive elements 14 can be disposed in one of the circuit layers, and another of the second conductive elements 14 can be disposed in another of the circuit layers; or all of the second conductive elements 14 can be disposed in one of the circuit layers.

Figure 1D:
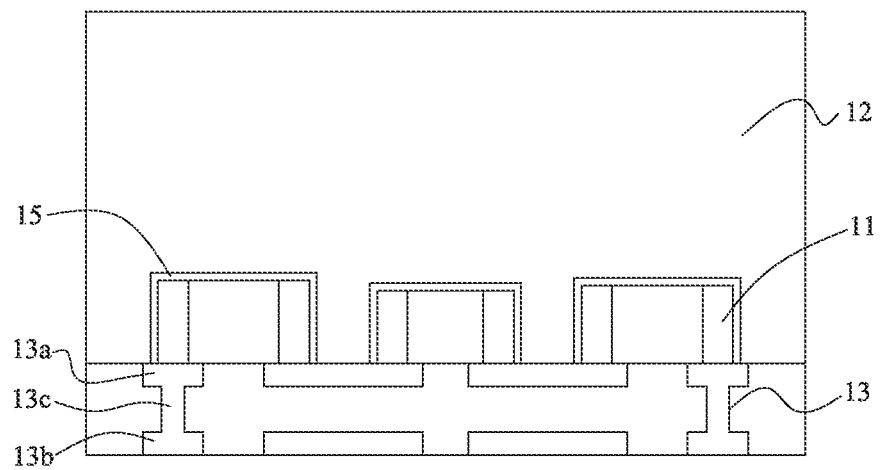
FIG. 1D to FIG. 1F illustrate a schematic cross-sectional view of a substrateless device having a shielding material therein.
Figure 1E:
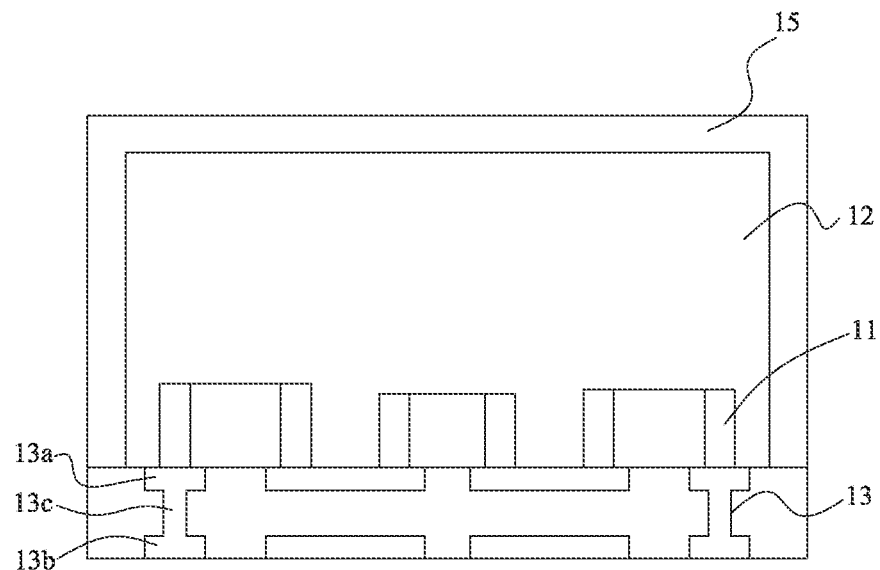
Figure 1F:
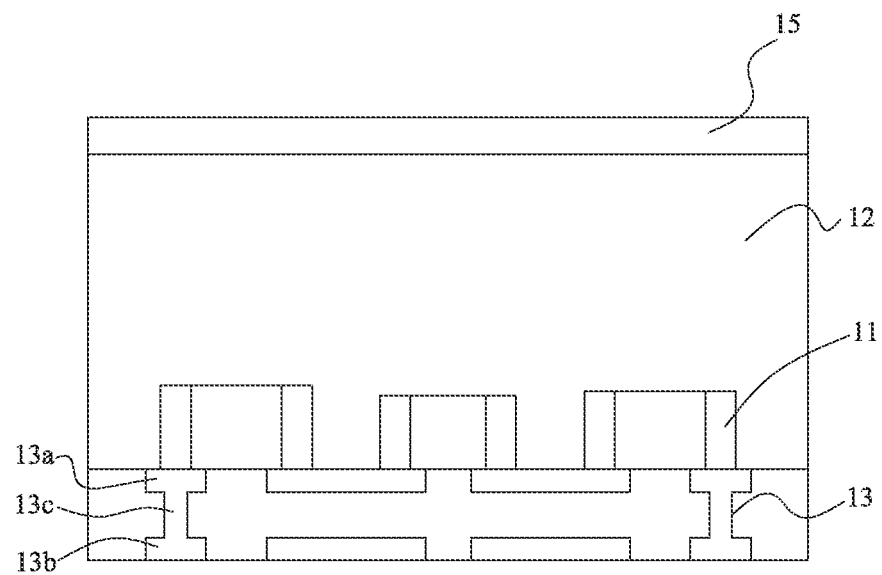

FIG. 1D to FIG. 1F illustrate a schematic cross-sectional view of a substrateless device 10 having a shielding material 15 therein. According to the electrical requirement, the substrateless device 10 can further comprise a shielding material 15 to reduce the interference between conductive elements or between modules. For example, at least one portion of the surface or the periphery of the first conductive elements 11 is covered with a shielding material 15 disposed in the encapsulant 12 (see FIG. 1D); or at least one portion of the surface of the encapsulant 12 is covered with a shielding material 15 (see FIG. 1E and FIG. 1F).

Figure 2:
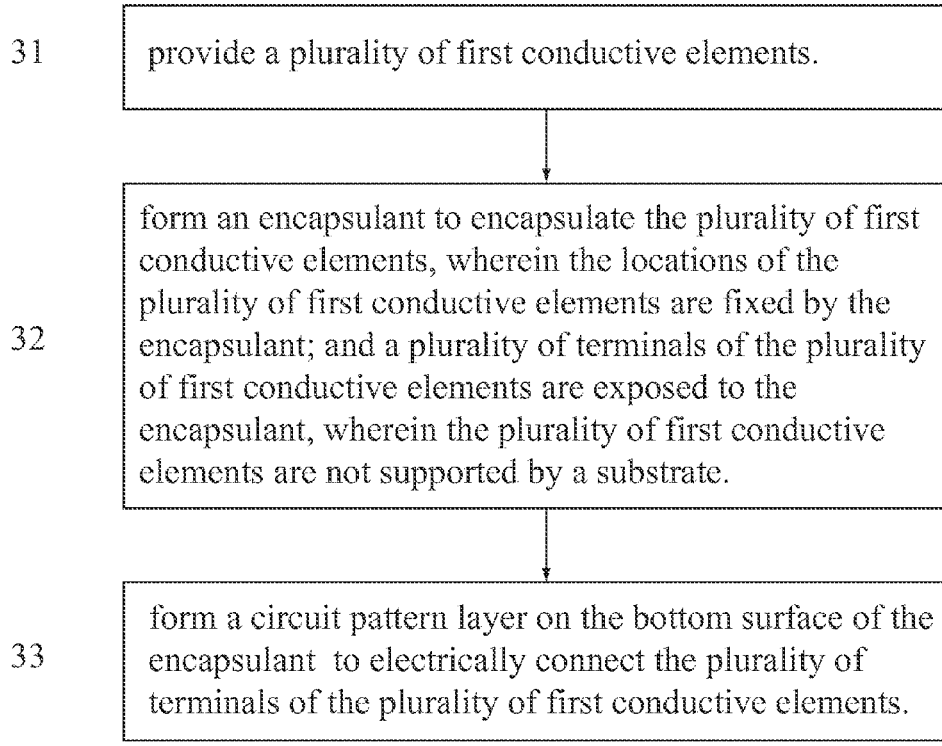
FIG. 2 is the process flow of manufacturing a substrateless device in FIG. 1A and FIG. 1B.

FIG. 2 is the process flow of manufacturing a substrateless device 10 in FIG. 1A and FIG. 1B.

In step 31, provide a plurality of first conductive elements 11. Each of the plurality of first conductive elements 11 can comprise at least one of IC chip, MOSFET, IGBT, diode, resistor, choke or capacitor.

In step 32, form an encapsulant 12 to encapsulate the plurality of first conductive elements 11, wherein the locations of the plurality of first conductive elements 11 are fixed by the encapsulant 12; and a plurality of terminals of the plurality of first conductive elements 11 are exposed outside the encapsulant 12, wherein the plurality of first conductive elements 11 are not supported by a substrate. Preferably, the terminals of the first conductive elements 11 are exposed outside the bottom surface of the encapsulant 12. Then, a post molding cure is performed. The encapsulant 12 can be made of any suitable material, such as epoxy, oxide or a polymer-based material. In one embodiment, at least one portion of the surface of a plurality of first conductive elements 11 is covered with a shielding material 15 before step 32.

In the preferred embodiment, a supporting body (not shown) is provided; a plurality of first conductive elements 11 are disposed on the supporting body; an encapsulant 12 is formed to encapsulate the plurality of first conductive elements 11; and the supporting body is removed to expose a plurality of terminals of the plurality of first conductive elements 11. In other words, step 31 further comprises providing a supporting body and disposing the plurality of first conductive elements 11 on the supporting body; wherein the step 32 further comprises removing the supporting body to expose the plurality of terminals of the plurality of first conductive elements 11 after forming the encapsulant 12 to encapsulate the plurality of first conductive elements 11. Alternatively, step 31 further comprises forming an adhesion layer (not shown) between the plurality of first conductive elements 11 and the supporting body; and step 32 further comprises removing the adhesion layer to expose the plurality of terminals of the plurality of first conductive elements 11 after removing the supporting body. The function of the supporting body is to position a conductive element thereon. The supporting body can be a carrier (e.g., glass substrate) or an adhesive tape.

In step 33, form a circuit pattern layer 13 on the bottom surface of the encapsulant 12 to electrically connect the plurality of terminals of the plurality of first conductive elements 11. Specifically speaking, the circuit pattern layer 13 is formed on the reversed bottom surface of the encapsulant 12. The circuit pattern layer 13 can be formed by performing a lithography process, which is widely adapted for multiple pins meeting customers' demand. Compared to a lead frame serving as pins (the space of the lead frame is too large to define the process accuracy), the lithography process can precisely define pins of smaller size. The circuit pattern layer 13 can comprise a plurality of circuit layers. For example, the circuit pattern layer 13 comprises a top RDL (redistribution layer) 13a, a bottom RDL 13b and a via layer 13c between the top RDL 13a and the bottom RDL 13b. The top RDL 13a makes electrical connection between the first conductive elements 11, and bottom RDL 13b further extends the electrodes of the first conductive elements 11 for external connection. To shrink module size, the second conductive element 14 can be disposed in the circuit pattern layer 13. In one embodiment, a shielding material 15 is disposed to cover at least one portion of the surface of the encapsulant 12.

Take the circuit pattern layer 13 comprising a top RDL (redistribution layer) 13a, a bottom RDL 13b and a via layer 13c between the top RDL 13a and the bottom RDL 13b for example and detailed process is listed as below. Any circuit pattern layer can be derived from the following process steps, and it doesn't be further described in detail herein.

(a) Perform a first lithography process to form a top RDL 13a. This step can comprise sputter, dry film lamination, exposure, development, plating, de-film and etching.

(b) Perform a second lithography process to form a via layer 13b. This step can comprise printing, exposure, development and cure.

(c) Perform a third lithography process to form a bottom RDL 13c. This step can comprise sputter, dry film lamination, exposure, development, plating, de-film and etching.

(d) Perform a fourth lithography process to perform Ni/Au electroplating. This step can comprise printing, exposure, development, cure, Ni plating and Au plating.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A method of forming a substrateless device, the method comprising the steps of:
    disposing a plurality of electronic devices on a supporting body, wherein each of at least one of the plurality of electronic devices is a discrete passive electrical component;
    forming an encapsulant to encapsulate the plurality of electronic devices;
    removing the supporting body for exposing a plurality of terminals of the plurality of electronic devices, wherein a first terminal of a first electronic device and a second terminal of a second electronic device are exposed outside the encapsulant; and
    forming at least one circuit pattern layer over the plurality of electronic devices, wherein the first terminal of the first electronic device is electrically connected to the second terminal of the second electronic device via at least one circuit pattern of said at least one circuit pattern layer, wherein a third electronic device is disposed in the at least one circuit pattern layer, wherein terminals of the third electronic device are electrically connected to the at least one circuit pattern layer.

2. The method according to claim 1, wherein the plurality of terminals of the plurality of electronic devices are exposed outside the bottom surface of the encapsulant.

3. The method according to claim 1, further comprising forming an adhesion layer on the supporting body before disposing the plurality of electronic devices on the supporting body, and removing the adhesive layer to expose the plurality of terminals of the plurality of electronic devices after removing the supporting body.

4. The method according to claim 1, wherein the at least one circuit pattern layer comprises a top RDL (redistribution layer), a bottom RDL and a via layer between the top RDL and the bottom RDL.

5. The method according to claim 1, wherein the supporting body is a carrier.

6. The method according to claim 5, wherein the carrier is a glass substrate.

7. The method according to claim 1, wherein the supporting body is an adhesive tape.

8. The method according to claim 1, wherein said at least one circuit pattern layer is formed by a lithography process.

9. The method according to claim 1, wherein the first electronic device is a first discrete passive electrical component, wherein said first discrete passive electrical component is a discrete resistor, a discrete inductor or a discrete capacitor and the second electronic device is a discrete MOSFET or a discrete IGBT.

10. A method of forming a substrateless device, the method comprising the steps of:
    disposing a plurality of discrete electronic devices on a supporting body, wherein each of at least one of the plurality of discrete electronic devices is a discrete passive electrical component;
    forming an encapsulant to encapsulate the plurality of discrete electronic devices so as to fix the relative positions of the plurality of discrete electronic devices;
    removing the supporting body for exposing a plurality of terminals of the plurality of discrete electronic devices, wherein a first terminal of a first discrete electronic device and a second terminal of a second discrete electronic device are exposed outside the encapsulant; and
    forming at least one circuit pattern layer over the plurality of discrete electronic devices, wherein the first terminal of the first discrete electronic device is electrically connected to the second terminal of the second discrete electronic device via at least one circuit pattern of said at least one circuit pattern layer, wherein a third electronic device is disposed in the at least one circuit pattern layer, wherein terminals of the third electronic device are electrically connected to the at least one circuit pattern layer.

11. The method according to claim 10, wherein the first discrete electronic device is a first discrete passive electrical component, wherein said first discrete passive electrical component is a discrete resistor, a discrete inductor or a discrete capacitor and the second electronic device is a discrete MOSFET or a discrete IGBT.

* * * * *